United States Patent
Moriya

(10) Patent No.: US 11,575,335 B2
(45) Date of Patent: Feb. 7, 2023

(54) ELECTROSTATIC CHUCK DEVICE

(71) Applicant: SAMSUNG ELECTRONICS CO., LTD., Suwon-si (KR)

(72) Inventor: Yoshiaki Moriya, Kanagawa (JP)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 5 days.

(21) Appl. No.: 17/182,466

(22) Filed: Feb. 23, 2021

(65) Prior Publication Data

US 2021/0305918 A1 Sep. 30, 2021

(30) Foreign Application Priority Data

Mar. 26, 2020 (JP) .............................. JP2020-055394
Oct. 20, 2020 (JP) .............................. JP2020-175754

(51) Int. Cl.
*H02N 13/00* (2006.01)
*H01L 21/683* (2006.01)

(52) U.S. Cl.
CPC ........... *H02N 13/00* (2013.01); *H01L 21/683* (2013.01); *H01L 21/6833* (2013.01); *H01L 21/6831* (2013.01)

(58) Field of Classification Search
CPC .............. H01L 21/683; H01L 21/6833; H01L 21/02; H01L 21/67063; H01L 21/67069; H01L 21/67109; H01L 21/6831; H01L 21/68757; H01L 21/306; H02N 13/00; C23F 1/00; H01J 37/32
USPC ......................................................... 361/234
See application file for complete search history.

(56) References Cited

U.S. PATENT DOCUMENTS

| | | | | |
|---|---|---|---|---|
| 2002/0050246 A1* | 5/2002 | Parkhe | ............... | H01L 21/67248 118/500 |
| 2015/0116689 A1* | 4/2015 | Lee | .................... | H01J 37/32715 355/72 |
| 2015/0129165 A1* | 5/2015 | Parkhe | ............... | H01L 21/67109 165/67 |
| 2016/0116689 A1 | 4/2016 | Hofrichter et al. | | |
| 2018/0269097 A1* | 9/2018 | Maeta | ............... | H01J 37/32642 |

FOREIGN PATENT DOCUMENTS

| | | |
|---|---|---|
| JP | 3485390 | 10/2003 |
| JP | 2009-302346 | 12/2009 |
| JP | 2013-149977 | 8/2013 |
| JP | 2017-112298 | 6/2017 |
| JP | 2019-104964 | 6/2019 |
| WO | 2017221631 | 11/2018 |

* cited by examiner

*Primary Examiner* — Danny Nguyen
(74) *Attorney, Agent, or Firm* — F. Chau & Associates, LLC

(57) ABSTRACT

The present disclosure provides an electrostatic chuck device capable of uniformly cooling or heating a fixedly adsorbed substrate. The electrostatic chuck device includes an electrostatic chuck plate, a bonding layer, and a base. The bonding layer has a bonding agent bonded to a rear surface of the electrostatic chuck plate. The base has a bonding surface bonded to the bonding layer and a plurality of protrusions radially extending from a central part toward an outer circumferential surface of the bonding surface. The ends of the respective protrusions on the central part may be arranged at intervals.

20 Claims, 7 Drawing Sheets

ELECTROSTATIC CHUCK DEVICE

This application claims priority from Japanese Patent Application No. 2020-055394 filed on Mar. 26, 2020 and No. 2020-175754 filed on Oct. 20, 2020 in the Japanese Intellectual Property Office, the disclosure of which is incorporated herein by reference in its entirety.

BACKGROUND

1. Technical Field

The present disclosure relates to an electrostatic chuck device.

2. Description of the Related Art

A chuck is a device used to hold another object, usually an object with radial symmetry. An electrostatic chuck is a chuck used for an electrostatic bonding process. Electrostatic bonding is the process of bonding multiple materials, where one atom of one material loses an electron to form a positive ion and the other material gains and electron to form a negative ion.

An electrostatic chuck device may include an electrostatic chuck plate configured to adsorb a specimen such as a wafer using an electrostatic force and a base with a cooling apparatus. The thickness of a bonding layer may be controlled using masking tape or a wire. Various materials may then be used for a bonding agent which bonds the electrostatic chuck plate to the base. However, the use of masking tape or a wire to control the thickness of the bonding layer is challenging and can lead to an inconsistent thickness. Additionally, thermal issues may arise due to thermal expansion. Therefore, there is a need in the art to control the thickness and temperature of a bonding process using an electrostatic chuck.

SUMMARY

The present disclosure provides an electrostatic chuck device in which a thickness of a bonding layer between an electrostatic chuck plate and a base is controllable with a high degree of precision and a fixedly adsorbed specimen is coolable or heatable uniformly. It should be noted that objects of the present invention are not limited to the above-described objects, and other objects of the present invention will be apparent to those skilled in the art from the following descriptions.

According to an aspect of the present disclosure, an electrostatic chuck device includes an electrostatic chuck plate, a bonding layer including a bonding agent bonded to a rear surface of the electrostatic chuck plate, and a base including a bonding surface bonded to the bonding layer and a plurality of protrusions on the bonding surface radially extending from a central part of the base toward an outer circumferential part of the base.

In the electrostatic chuck device, ends of the respective protrusions may be arranged at intervals around the central part. In the electrostatic chuck device, the bonding surface may have a central flat part surrounded by the ends in the central part. In the electrostatic chuck device, the plurality of protrusions may include a plurality of first protrusions with a first length extending in an extension direction of the protrusion and a plurality of second protrusions with a second length smaller than the first length. Here, ends of the second protrusions on the central part may be arranged to be closer to the outer circumferential part than ends of the first protrusions on the central part.

In the electrostatic chuck device, holes may be formed in the bonding surface near the ends of the second protrusions on the central part. In the electrostatic chuck device, ends of at least two of the protrusions on the central part may be connected. In the electrostatic chuck device, the protrusions may be embedded in the bonding agent.

In the electrostatic chuck device, the protrusions may come into direct contact with the rear surface, and an area of the protrusions coming into contact with the rear surface may be smaller than or equal to 60% of an area of the rear surface. In the electrostatic chuck device, the base may include a flow path through which a refrigerant flows.

In the electrostatic chuck device, a Young's modulus of the base may be 200 GPa or higher, a difference between a thermal expansion rate of the base and a thermal expansion rate of the electrostatic chuck plate may be within a range of $1\times10^{-6}/°$ C., and heat conductivity of the base may be 50 W/(mK) or higher.

In the electrostatic chuck device, the base may include at least one of aluminum, metal-based composite material, silicon carbide, silicon, aluminum oxide, and aluminum nitride. In the electrostatic chuck device, the electrostatic chuck plate may include an internal electrode and include at least one of yttrium oxide, silicon carbide, aluminum oxide, and aluminum nitride. In the electrostatic chuck device, the bonding agent may include at least one of indium, aluminum, silver, and tin, include an alloy including at least one of indium, aluminum, silver, and tin, or include at least one of a silicone resin, an acrylic resin, and an epoxy resin.

The bonding agent may include a thermosetting resin and have heat conductivity of 4.0 W/(mK) or higher and a Young's modulus of 1 GPa or lower at a temperature of $-150°$ C.

The bonding agent may have a rate of change in the Young's modulus of 500% or less when being cooled at a temperature from 23° C. to $-150°$ C. and have a tensile load of fifteen times per area of 12.6 cm$^2$ when being cooled at a temperature from 23° C. to $-150°$ C. The bonding agent may include at least one of a silicone resin, an epoxy resin, and an acrylic resin and have a decomposition temperature of 260° C. or higher.

The bonding agent may include 35% to 45% of a heat-conductive filler. Here, the heat-conductive filler may be 25 µm or less with a grain size of D90 and be less than 10 µm with a grain size of D50, and the viscosity of the bonding agent may be lower than or equal to 10 Pas. A decomposition temperature of the bonding agent before thermosetting may be 300° C. or higher. The bonding agent may include a heat-conductive filler, and the heat-conductive filler may be 25 µm or less with a grain size of D90 and be less than 10 µm with a grain size of D50.

The heat-conductive filler included in the bonding agent may include at least one of aluminum nitride, silicon nitride, boron nitride, and silicon carbide. Both the electrostatic chuck plate and the base may include at least one of aluminum, yttrium oxide, silicon carbide, aluminum oxide, and aluminum nitride. A difference in thermal expansion between of the electrostatic chuck plate and the base may be within a range of $1\times10^{-6}/°$ C. at each temperature from 23° C. to $-100°$ C.

Other details of embodiments will be included in the detailed description and the drawings.

BRIEF DESCRIPTION OF THE DRAWINGS

The above and other aspects and features of the present disclosure will become more apparent by describing embodiments thereof in detail with reference to the attached drawings, in which.

DETAILED DESCRIPTION OF THE EMBODIMENTS

Figure 1:
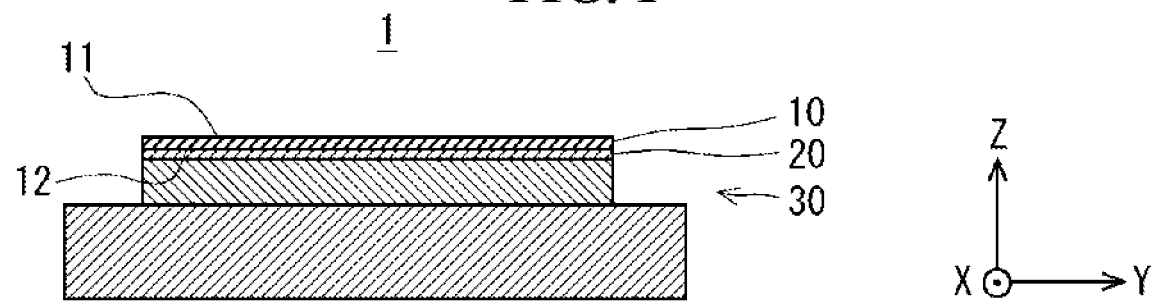
FIG. 1 is a cross-sectional view illustrating an electrostatic chuck device according to Embodiment 1.

The present disclosure relates generally to an electrostatic chuck device. More particularly, the present disclosure provides an electrostatic chuck device capable of uniformly cooling or heating a fixedly adsorbed substrate. The present disclosure also describes methods for performing electrostatic bonding.

In some cases, the thickness of a bonding layer during an electrostatic bonding process may be controlled using masking tape or a wire. However, since the thickness deviation of tape or wire may cause a thickness deviation of a bonding layer, it is difficult to maintain a degree of precision of a thickness of the bonding layer.

Additionally, or alternatively, in a method of controlling a thickness of a bonding layer by disposing a wire, it is difficult to specify the position where the wire is disposed. Furthermore, a deviation may occur based on contact and heat transfer between a base and an electrostatic chuck plate due to the disposition of the wire. Additionally, or alternatively, a bonding agent may be mixed with foreign substances due to the disposition of the wire. Accordingly, properties of the bonding agent may vary locally when tape or wire is used, and a concentration of stress may be caused as a result.

Additionally, or alternatively, a bonding agent may be divided by disposition of the wire. Therefore, movement of the bonding agent may be interfered with during extension or contraction caused by a difference in thermal expansion. As a result, a deviation may occur in a thickness of the bonding layer after bonding, and unevenness may occur based on contact and heat transfer. Additionally, or alternatively, damage to the bonding agent may occur in service environments accompanying thermal expansion or thermal contraction. Due to the materials used in the wire, it is difficult to apply adequate pressure for bonding and in some cases deviation occurs in the thickness of the bonding layer.

As described above, it is difficult to control the thickness of the bonding layer with a high degree of precision when using masking tape or wire in an electrostatic bonding process. Furthermore, if there is no portion which performs a function of a stopper configured to adjust a thickness of a bonding layer, it is difficult to correct a thickness deviation of the bonding layer. Therefore, it is difficult to control the thickness of the bonding layer with a high degree of precision.

In addition, when using a resin adhesive, the thickness of a bonding layer may be controlled using a hardener of the resin adhesive or a ceramic plate. However, in the case of the hardener, deformation under a load may occur. Furthermore, it is difficult to apply an adequate load for adjusting the thickness of the bonding layer. Thus, when a ceramic plate is used, a concentration of stress may occur that damages an electrostatic chuck plate as when using masking tape or wire.

Accordingly, the present disclosure provides an electrostatic chuck device that may be used to achieve a uniform bonding layer during an electrostatic bonding process. An embodiment of the electrostatic chuck device includes an electrostatic chuck plate, a bonding layer, and a base. The bonding layer has a bonding agent bonded to a rear surface of the electrostatic chuck plate. The base has a bonding surface bonded to the bonding layer and a plurality of protrusions radially extending from a central part toward an outer circumferential surface of the bonding surface. The ends of the respective protrusions on the central part may be arranged at intervals.

For clarity of description, the following statements and drawings will be appropriately omitted and simplified. Additionally, or alternatively, throughout the drawings, like elements will be referred to as like reference numerals, and a repetitive description will be omitted as necessary.

Embodiment 1

Hereinafter, an electrostatic chuck device according to a first embodiment (Embodiment 1) will be described. First, components of the electrostatic chuck device will be described. Subsequently, respective components of an electrostatic chuck plate, a bonding layer, and a base included in the electrostatic chuck device will be described. Subsequently, a method of manufacturing the electrostatic chuck device will be described. Subsequently, a modified example of Embodiment 1 and a comparative example for comparison to Embodiment 1 will be described. Subsequently, an evaluation of the electrostatic chuck device with respect to Embodiment 1, the modified example, and the comparative example will be described with reference to Embodiments 1-1 to 1-4.

Components of an Electrostatic Chuck Device

FIG. 1 is a cross-sectional view illustrating an electrostatic chuck device according to Embodiment 1. As shown in FIG. 1, an electrostatic chuck device 1 includes an electrostatic chuck plate 10, a bonding layer 20, and a base 30. The electrostatic chuck device 1 adsorbs and fixes a specimen onto an adsorption surface 11 of the electrostatic chuck plate 10 using an electrostatic force. The specimen includes, for example, a plate-shaped wafer, a sputtering target, and the like. Meanwhile, the specimen is not limited to the wafer, the sputtering target, and the like and includes anything which may be adsorbable onto the adsorption surface 11.

Here, for convenience of description of the electrostatic chuck device 1, an XYZ rectangular coordinate system is introduced.

A direction perpendicular to the adsorption surface 11 of the electrostatic chuck plate 10 is referred to as a Z-axis direction. A plane parallel to the adsorption surface 11 of the electrostatic chuck plate 10 is referred to as an XY-plane. For example, a side of the adsorption surface 11 of the electrostatic chuck plate 10 is an upward direction and referred to as a positive Z-axis direction. A rear surface 12 of the electrostatic chuck plate 10 is a downward direction and referred to as a negative Z-axis direction. Meanwhile, the upward direction and the downward direction are for convenience of description with relation to the electrostatic chuck device 1 and do not indicate directions in which the electrostatic chuck device 1 is actually disposed while being used.

Electrostatic Chuck Plate

The electrostatic chuck plate 10 has a plate shape and includes the adsorption surface 11 configured to adsorb a specimen with an electrostatic force and the rear surface 12 opposite to the adsorption surface 11. The electrostatic chuck plate 10 is, for example, a circular plate shape. Meanwhile, the electrostatic chuck plate 10 is not limited to the circular plate shape and has no limitation in shape, for example, to a rectangular plate shape and the like.

The electrostatic chuck plate 10 includes an internal electrode (not shown) therein. The electrostatic chuck plate 10 applies a voltage to the internal electrode and fixedly adsorbs the specimen onto the adsorption surface 11 with an electrostatic force.

As a material, the electrostatic chuck plate 10 includes, for example, ceramics. The electrostatic chuck plate 10 may include, for example, at least one of aluminum oxide ($Al_2O_3$) and aluminum nitride (AlN).

Table 1 is an example comparison of material properties. Table 1 shows density $kg/m^2$, a thermal expansion rate $10^{-6}/°$ C., Young's modulus GPa, Poisson's ratio, and thermal conductivity W/(mK) in $Al_2O_3$, metal matrix composites (hereinafter, referred to as MMC), AlN, silicon carbide (SiC), indium, and silicone resin.

TABLE 1

| Comparison of material properties | $Al_2O_3$ | MMC | AlN | SiC | Indium | Silicone |
|---|---|---|---|---|---|---|
| Density [$kg/m^3$] | 3900 | 3000 | 3300 | 3100 | 7300 | 1030 |
| Thermal expansion rate [$10^{-6}/°$ C.] | 7 | 7 | 4 | 3 | 30 | 20 |
| Young's modulus [GPa] | 380 | 260 | 330 | 430 | 11.5 | 1 × 10-3 |
| Poisson's ratio | 0.23 | 0.20 | 0.24 | 0.17 | 0.45 | 0.50 |
| Heat conductivity [W/(mK)] | 30 | 160 | 150 | 150 | 80 | 0.2 |

As shown in Table 1, when a material of the electrostatic chuck plate 10 is $Al_2O_3$ and a material of the base 30 is MMC, a difference between thermal expansion rates of the electrostatic chuck plate 10 and the base 30 may be smaller than or equal to $1 \times 10^{-6}/°$ C. Additionally, or alternatively, when a material of the electrostatic chuck plate 10 is AlN and a material of the base 30 is SiC, a difference between thermal expansion rates of the electrostatic chuck plate 10 and the base 30 may be smaller than or equal to $1 \times 10^{-6}/°$ C. Stress generated between the electrostatic chuck plate 10 and the base 30 may be relieved using the above material.

Bonding Layer

The bonding layer 20 is disposed between the electrostatic chuck plate 10 and the base 30. The bonding layer 20 includes a bonding agent bonded to the rear surface of the electrostatic chuck plate 10 and a bonding surface 31 of the base 30. The bonding agent may include, for example, at least one of indium, aluminum, silver, and tin. Additionally, or alternatively, the bonding agent may be an alloy with, for example, at least one of indium, aluminum, silver, and tin. Additionally, or alternatively, the bonding agent may include at least one of a silicone resin, an acrylic resin, an epoxy resin.

For example, as shown in Table 1, when the bonding agent includes indium or a silicone resin, there is a great difference between the thermal expansion rates of the electrostatic chuck plate 10 and the base 30. However, the electrostatic chuck device 1, according to the embodiment, may reduce the impact of the difference between thermal expansion rates due to a protrusion 32 of the base 30, which will be described below.

When porosity is defined as the rate of pore contents in the bonding agent forming the bonding layer 20, the porosity of the bonding agent may be smaller than or equal to 5%. Accordingly, a heat conductivity and a heat transfer rate between the electrostatic chuck plate 10 and the base 30 may be increased to suppress damage caused by thermal expansion and thermal contraction.

Base

The base 30 is bonded to the rear surface 12 of the electrostatic chuck plate 10 using the bonding layer 20. A surface of the base 30, which may be bonded to the bonding layer 20, is referred to as the bonding surface 31. Accordingly, the base 30 includes the bonding surface 31 bonded to the bonding layer 20.

The base 30 may include a material with stiffness. For example, the base 30 may include at least one of aluminum (Al), MMC, SiC, and silicon (Si). As described above, the difference between thermal expansion rates of the electrostatic chuck plate 10 and the base 30 may be smaller than or equal to $1\times10^{-6}/°$ C. by selecting an adequate material in reference to Table 1.

The base 30 may include a material with a Young's modulus greater than or equal to 200 GPa. Young's modulus is greater than or equal to 200 GPa so that the material of the base 30 may have stiffness. Accordingly, the electrostatic chuck plate 10 may be pressed against the bonding surface 31 through the bonding layer 20 with a certain pressure. Accordingly, a thickness of the bonding layer 20 with the bonding agent between the electrostatic chuck plate 10 and the base 30 may be controlled with a high degree of precision using the protrusion 32 formed on the bonding surface 31.

Additionally, or alternatively, the heat conductivity of the base 30 may be higher than or equal to 50 W/(mK). Accordingly, heat transfer from the base 30 to the electrostatic chuck plate 10 may be improved through the bonding layer 20.

Figure 2:
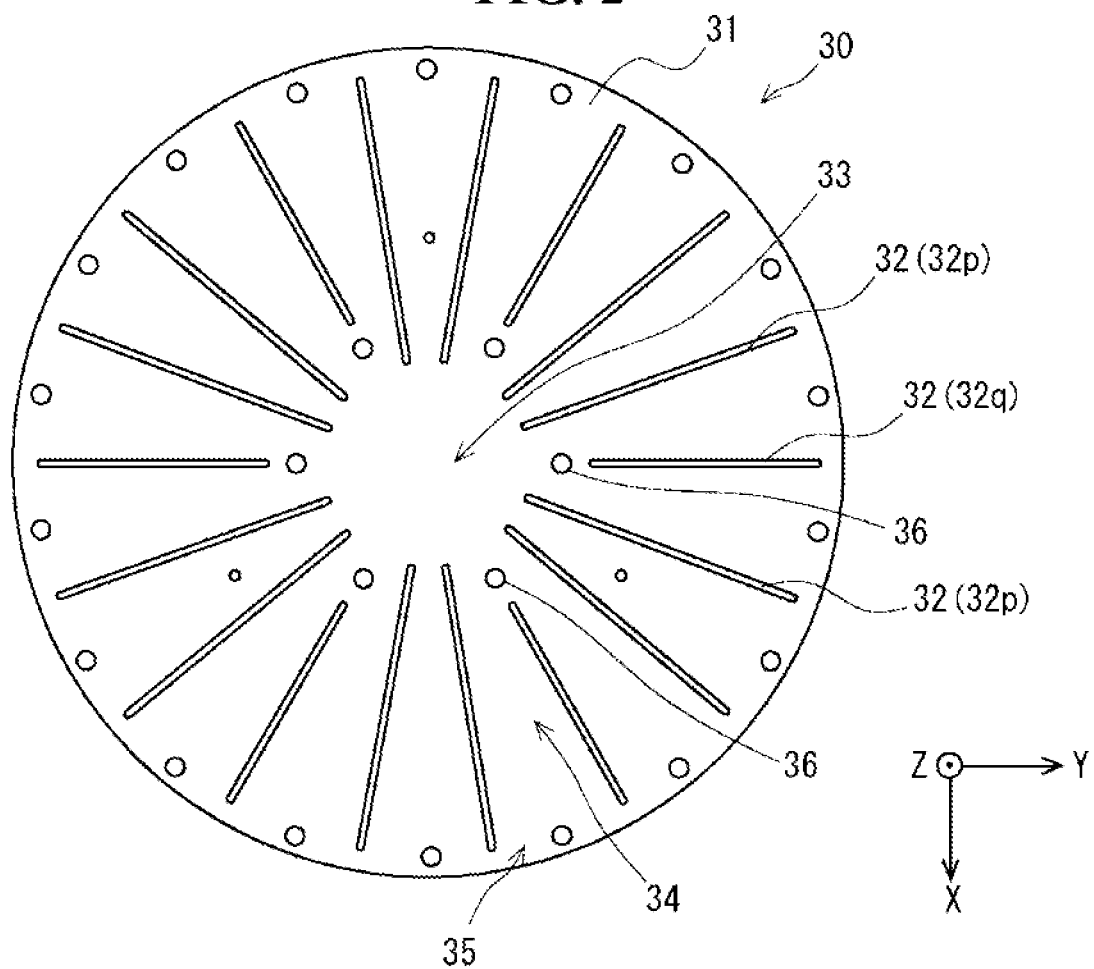
FIG. 2 is a plan view illustrating a bonding surface of a base in the electrostatic chuck device according to Embodiment 1.
Figure 3:
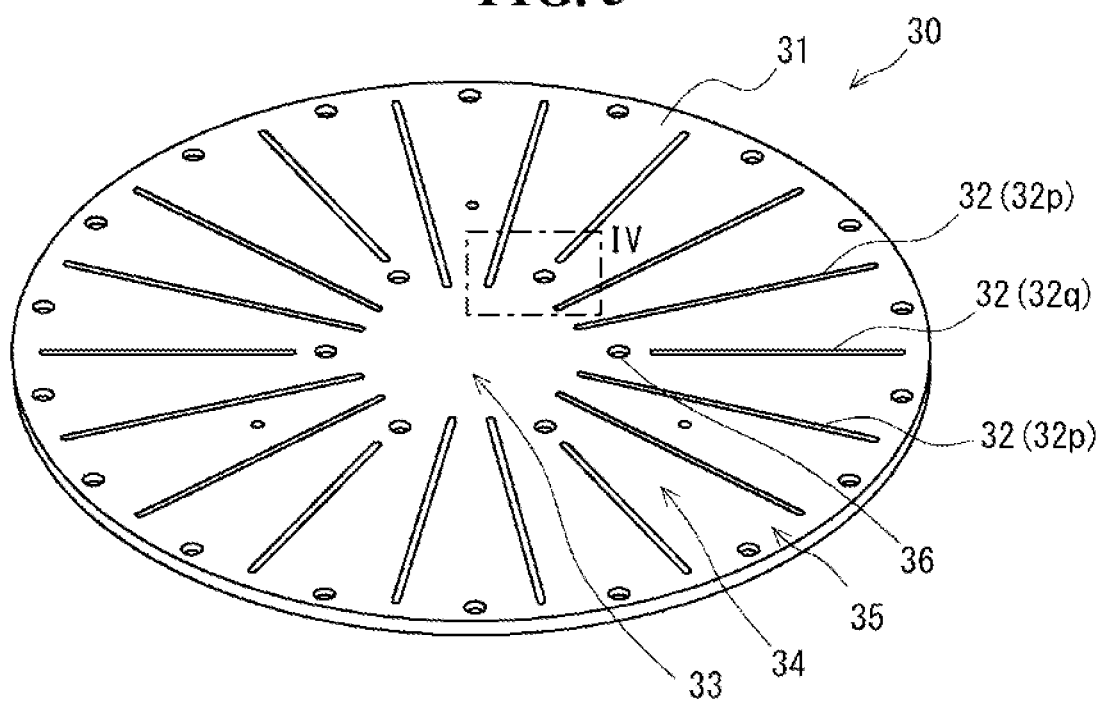
FIG. 3 is a perspective view illustrating the bonding surface of the base in the electrostatic chuck device according to Embodiment 1.
Figure 4:
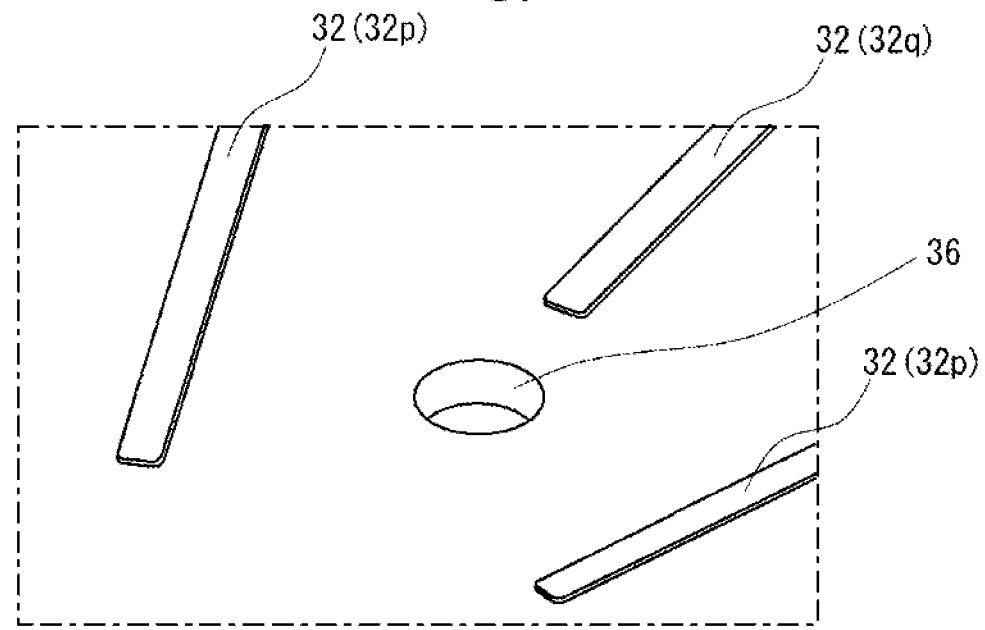
FIG. 4 is an enlarged view of area IV in FIG. 3 and illustrating the bonding surface of the base in the electrostatic chuck device according to Embodiment 1.
Figure 5:
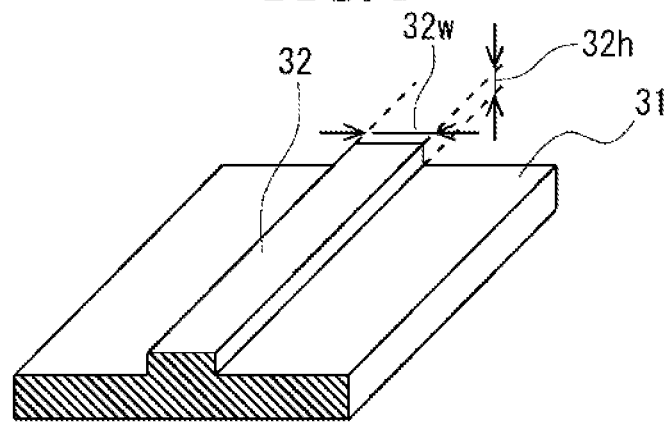
FIG. 5 is a cross-sectional perspective view illustrating a protrusion of the base in the electrostatic chuck device according to Embodiment 1.

FIG. 2 is a plan view illustrating the bonding surface 31 of the base 30 in the electrostatic chuck device 1 according to Embodiment 1. FIG. 3 is a perspective view illustrating the bonding surface 31 of the base 30 in the electrostatic chuck device 1 according to Embodiment 1. FIG. 4 is an enlarged view of area IV of FIG. 3 and illustrating the bonding surface 31 of the base 30 in the electrostatic chuck device 1 according to Embodiment 1. FIG. 5 is a cross-sectional perspective view illustrating the protrusion 32 of the base 30 in the electrostatic chuck device 1 according to Embodiment 1. To prevent the drawings from being complicated, only some of protrusions 32 and holes 36 will be given reference numerals, and reference numerals of other protrusions 32 and holes 36 will be omitted.

As shown in FIGS. 2 to 5, a plurality of such protrusions 32 are formed on the bonding surface 31 of the base 30. The plurality of protrusions 32 extend radially from a central part toward an outer circumferential part of the bonding surface 31. An end of the protrusion 32 on the central part is disposed to be spaced an interval apart from an end of the neighboring protrusion 32 on the central part. Accordingly, the bonding surface 31 has a central flat part 33, which may be flat and surrounded by ends of the protrusions 32 on the central part.

The bonding surface 31 of the base 30 includes the central flat part 33 formed on the central part, a protrusion arrangement part 34 formed in an annular shape to surround the central flat part 33, and an outer circumferential part 35 formed in an annular shape to surround the protrusion arrangement part 34. The plurality of protrusions 32 are formed on the protrusion arrangement part 34.

As shown in FIG. 5, a width 32w of the protrusion 32 is, for example, 5 to 10 mm. A height 32h of the protrusion 32 is, for example, 50 μm to 1 mm and may be 100 μm. Meanwhile, the width 32w and the height 32h of the protrusion 32 are not limited to the above values and may be appropriately changed.

As shown in FIGS. 2 and 3, the plurality of protrusions 32 may include a plurality of protrusions 32p and a plurality of protrusions 32q, which have different lengths in a direction in which the protrusions 32 extend. A length of the protrusions 32q is smaller than a length of the protrusions 32p (the length of the protrusions 32p>the length of the protrusions 32q). Additionally, or alternatively, ends of the protrusions 32q on the central flat part 33 are arranged to be closer to the outer circumferential part 35 than ends of the protrusions 32p on the central flat part 33. Meanwhile, the protrusions 32p and the protrusions 32q will be referred to collectively as the protrusions 32.

The ends of the protrusions 32p on the central flat part 33 are located on a boundary between the central flat part 33 and the protrusion arrangement part 34. The ends of the protrusions 32q on the central flat part 33 are located to be closer to the protrusion arrangement part 34 than the boundary between the central flat part 33 and the protrusion arrangement part 34. Ends of the protrusions 32p and the protrusions 32q on the outer circumferential part 35 are located on a boundary between the protrusion arrangement part 34 and the outer circumferential part 35. A diameter of the central flat part 33 may be, for example, 50 mm when the bonding surface 31 has a diameter of 300 mm.

The protrusions 32 may be embedded in the bonding agent in bonding layer 20. The protrusions 32 may come into direct contact with the rear surface 12 of the electrostatic chuck plate 10. Additionally, or alternatively, an area in which the protrusions 32 come into contact with the rear surface 12 of the electrostatic chuck plate 10 may be smaller than or equal to 60% of the rear surface 12. Accordingly, a heat transfer rate between the electrostatic chuck plate 10 and the base 30 may be improved. Additionally, or alternatively, damage may be suppressed to the bonding agent caused by thermal expansion and thermal contraction.

The base 30 may include a flow path (not shown) through which a refrigerant flows. For example, the base 30 includes a flow path built therein. A hole 36 may be formed in the bonding surface 31 of the base 30. Through the hole 36, for example, wiring and the like of an internal electrode of the electrostatic chuck plate 10 may pass. In a case in which the hole 36 is formed, the hole 36 may be formed near an end of a central part of the protrusion 32q. Accordingly, an area of the central flat part 33 may be increased and damage to the bonding agent caused by thermal expansion and thermal contraction may be suppressed.

Figure 6:
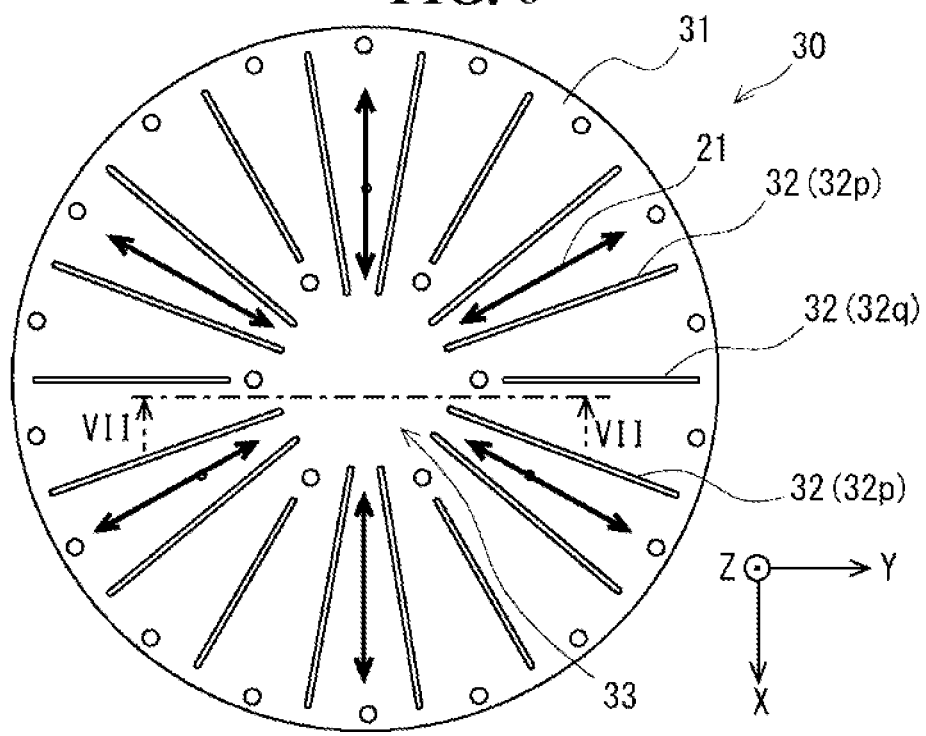
FIG. 6 is a plan view illustrating a thermal contraction process of a bonding agent which is being cooled in the electrostatic chuck device according to Embodiment 1.
Figure 7:
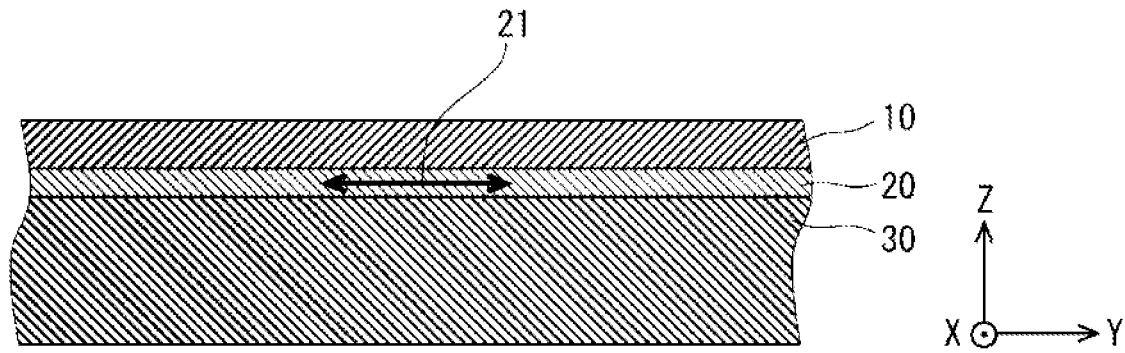
FIG. 7 is a cross-sectional view illustrating the thermal contraction process of the bonding agent which is being cooled in the electrostatic chuck device according to Embodiment 1 and illustrates a cross-section taken along line VII-VII of FIG. 6.

FIG. 6 is a plan view illustrating a thermal contraction process of the bonding agent, which is being cooled in the electrostatic chuck device 1 according to Embodiment 1. FIG. 7 is a cross-sectional view illustrating the thermal contraction process of the bonding agent, which is being cooled in the electrostatic chuck device 1 according to Embodiment 1 and illustrates a cross-section taken along line VII-VII of FIG. 6.

As shown in FIGS. 6 to 7, a plurality of such protrusions 32 radially extending are formed on the bonding surface 31 of the base 30. The bonding agent thermally contracts while being cooled. A direction 21 in which the bonding agent thermally contracts is a radial direction of the bonding surface 31. Accordingly, since a direction in which the protrusions 32 extend is the same as the direction 21 in which the bonding agent thermally contracts, stresses generated between the electrostatic chuck plate 10 and the base 30 and the bonding layer 20 may be relieved. Meanwhile, the above stress relief is effective for cooling in a process of manufacturing the electrostatic chuck device 1 and for thermal expansion when a temperature increases and thermal contraction when a temperature decreases while the electrostatic chuck device 1 is used.

Additionally, or alternatively, the central flat part 33 is formed on the bonding surface 31 of the base 30. In the central flat part 33, an extension or contraction of the bonding agent may be adjusted. Accordingly, the bonding agent may be freely deformable, such as during thermal contraction in cooling during a manufacturing process and thermal expansion or thermal contraction when a temperature increases or decreases in use. Accordingly, a sync mark or a defect caused by thermal expansion or thermal contraction of the bonding layer 20 may be suppressed.

A pitch in the arrangement of the protrusions 32 may be optimized by a thickness of the bonding layer 20. For example, when the thickness of the bonding layer 20 is small, the pitch of the protrusions 32 may increase. Then, the bonding layer 20 may include a bonding agent, which may be flat in a horizontal direction. Meanwhile, when the thickness of the bonding layer 20 is great, the pitch of the protrusions 32 may decrease. Then, the bonding layer 20 may include a bonding agent, which may be thin and long in a vertical direction. Both of the above bonding layers 20 may have the same amount of bonding agent.

Figure 8:
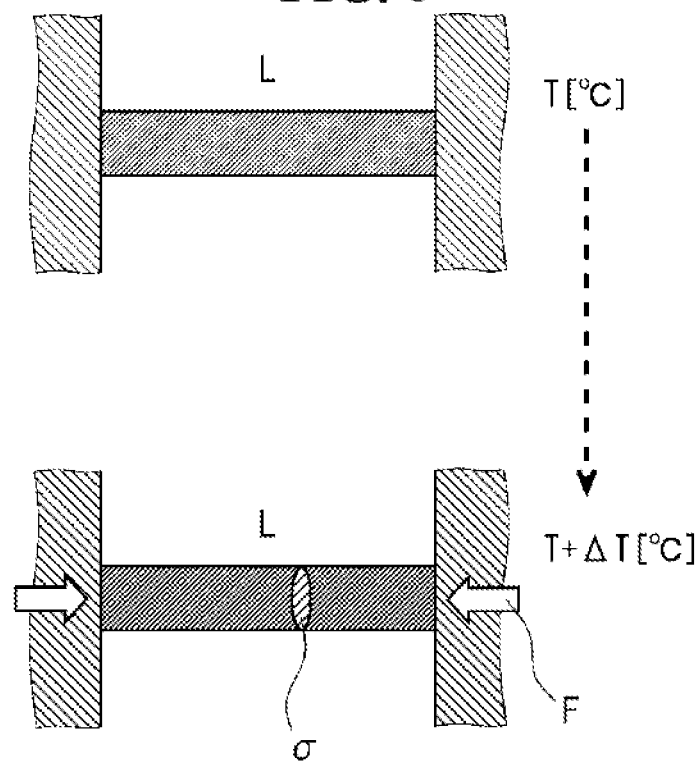
FIG. 8 is a view illustrating a model of calculating stress generated in the bonding agent disposed between protrusions in the electrostatic chuck device according to Embodiment 1.

FIG. 8 is a view illustrating a model of calculating stress generated in the bonding agent disposed between the protrusions 32 in the electrostatic chuck device 1 according to Embodiment 1. Since the base 30 has a low thermal expansion rate, as shown in FIG. 8, stress σ of the bonding agent and a force F generated in the bonding agent are calculated using Equation 1 and Equation 2 when a temperature T° C. changes to a temperature T+ΔT° C. Here, α refers to a thermal expansion rate, ΔT refers to a temperature difference, E refers to Young's modulus, and A refers to a cross-section of the bonding agent. The cross-section A is calculated using a height H and a width W of the bonding agent between the protrusions 32.

$$\sigma = -\alpha \Delta TE \qquad \text{<Equation 1>}$$

$$F = -\alpha \Delta TEA \qquad \text{<Equation 2>}$$

Table 2 illustrates parameters for calculating the stress σ when the bonding agent is indium.

TABLE 2

|  | Indium | Symbols |
|---|---|---|
| Thermal expansion rate [$10^{-6}$/° C.] | 30 | α |
| Young's modulus [GPa] | 11.5 | E |
| Temperature difference [° C.] | −250 | ΔT |
| Temperature before change [° C.] | 150 | T |
| Temperature after change [° C.] | −100 | T + ΔT |
| Stress [MPa] | 86.25 | σ |

Here, as shown in Table 2, when a thermal expansion rate α=30×10$^{-6}$/° C., Young's modulus E=11.5 GPa, a temperature difference ΔT=−250° C., the stress is determined as σ=86.25 MPa. A positive stress σ indicates tensile stress, and a negative stress σ indicates compress stress. Additionally, or alternatively, a positive value of the force F indicates a tensile load, and a negative value of the force F indicates a compressive load.

Table 3 illustrates the cross-section A and the generated force F of the bonding agent disposed between the protrusions 32 in the electrostatic chuck device 1 according to Embodiment 1.

TABLE 3

| Cross-section (A) [mm$^2$] | 1.4 | 4.8 | 7.0 | 24 | 2.5 |
|---|---|---|---|---|---|
| Height (H) × width (W) | 0.1 × 14 | 0.1 × 48 | 0.5 × 14 | 0.5 × 48 | 0.5 × 5 |
| Generated force (F) [N] | 120.8 | 414 | 603.8 | 2070 | 215.6 |

As shown in Table 3, as the cross-section A of the bonding agent increases, the force F generated in the bonding agent increases. For example, when the height H of the bonding agent is uniform, the force F increases as the width W of the bonding agent increases. Additionally, or alternatively, when the width W of the bonding agent is uniform, the force F increases as the height H of the bonding agent increases. Accordingly, to equalize the force generated in the bonding layer 20, the cross-section A of the bonding agent may be uniform.

In the embodiment, the plurality of protrusions 32 radially extend on the bonding surface 31. Accordingly, an interval between neighboring protrusions 32 increases toward the outer circumferential part 35. For example, the width of the bonding agent gradually increases toward the outer circumferential part 35. Here, the plurality of protrusions 32 may include the plurality of protrusions 32p and the plurality of protrusions 32q with a smaller length than the length of the protrusions 32p. Additionally, or alternatively, the ends of the protrusions 32q on the central flat part 33 are arranged to be closer to the outer circumferential part 35 than the ends of the protrusions 32p on the central flat part 33. Accordingly, since the width W of the bonding agent on the outer circumferential part 35 may be reduced, the force F generated in the bonding agent may be equalized.

<Method of Manufacturing Electrostatic Chuck Device>

Figure 9:
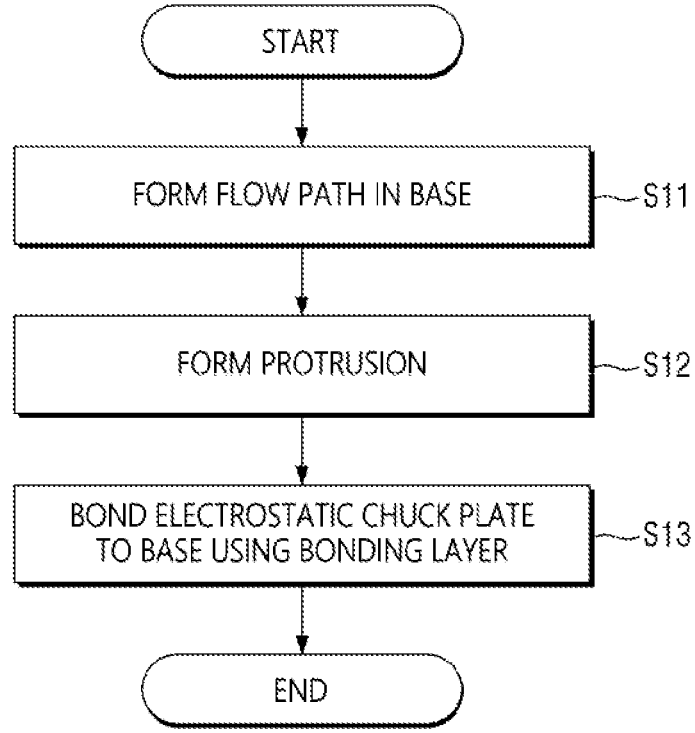
FIG. 9 is a flowchart illustrating a method of manufacturing the electrostatic chuck device according to Embodiment 1.

Next, a method of manufacturing the electrostatic chuck device 1 will be described. FIG. 9 is a flowchart illustrating the method of manufacturing the electrostatic chuck device 1, according to Embodiment 1. As shown in operation 11 of FIG. 9, a flow path is formed in the base 30. For example, a groove serving as the flow path is formed through machining a lower member forming a bottom of the base 30. Additionally, or alternatively, an upper member forming a top of the base 30 is bonded to the lower member forming the groove using an aluminum-brazed material. Accordingly, the flow path is included. As described above, the flow path is formed in the base 30.

Subsequently, as shown in operation 12, the protrusions 32 are formed. For example, after the upper member is bonded to the lower member, the base 30 is machined to have a certain shape. Subsequently, the protrusions 32 are formed in the bonding surface 31 of the base 30 through sand-blast processing or the like.

The protrusions 32 may be regarded as being formed in the rear surface 12 of the electrostatic chuck plate 10. However, the electrostatic chuck plate 10 is thin and easily deformable while being bonded. Accordingly, the protrusions 32 may be formed in the bonding surface 31 of the base 30, which has an adequate thickness and is difficult to deform.

The arrangement of the protrusions 32 varies according to the thickness of the bonding layer 20. For example, a pitch of the protrusions 32 may vary within a range of 5 to 50 mm in which a bonding force of the bonding layer 20 is not influenced. The pitch of the protrusions 32 may be small when the bonding layer 20 is thick and may be great when the bonding layer 20 is thin.

Meanwhile, to perform insulation treatment on the base 30, a film may be formed on a surface of the base 30 by spraying a material of $Al_2O_3$ thereon. In this case, the uniform protrusions 32 may be formed on the film formed by spraying.

Next, as shown in operation 13, the electrostatic chuck plate 10 is bonded to the base 30 using a bonding layer. For example, a material of indium is placed on the rear surface 12 of the electrostatic chuck plate 10 with an internal electrode and the bonding surface 31 of the base 30 and heated at a temperature 200° C. When the material of indium is melted, the rear surface 12 of the electrostatic chuck plate 10 is attached to the bonding surface 31 of the base 30. Additionally, or alternatively, a load is applied to the electrostatic chuck plate 10. The load may be, for example, 3 kPa.

Meanwhile, the load is not needed. However, a load of 1 kPa or higher may be applied to precisely control a thickness. While the load is being applied, heating is performed, for example, for 30 min. Subsequently, heating is stopped and cooling is performed to room temperature and the indium is checked to be solidified. As described above, the electrostatic chuck device 1 may be manufactured.

Modified Example

Hereinafter, an electrostatic chuck device according to a modified example of the embodiment will be described. The electrostatic chuck device, according to the modified example, has a plurality of protrusions 32 with a different shape from that of Embodiment 1. In detail, the plurality of protrusions 32 of the modified example are connected at a central part.

Figure 10:
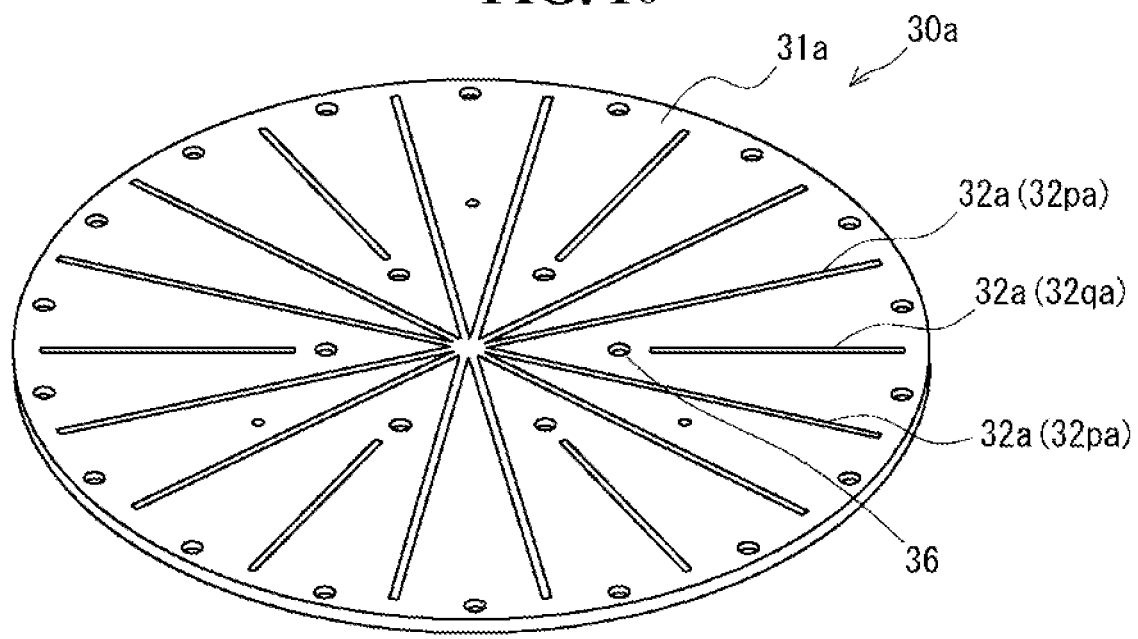
FIG. 10 is a perspective view illustrating a bonding surface of a base in an electrostatic chuck device according to a modified example of Embodiment 1.

FIG. 10 is a perspective view illustrating a bonding surface 31*a* of a base 30*a* in the electrostatic chuck device according to the modified example of Embodiment 1. As shown in FIG. 10, in the electrostatic chuck device according to the modified example, like the embodiment 1, the plurality of protrusions 32*a* extend radially from the central part toward an outer circumferential part of the bonding surface 31*a* and the plurality of protrusions 32*a* include a plurality of protrusions 32*pa* and a plurality of protrusions 32*qa* with a length smaller than a length of the protrusions 32*pa*. However, the central flat part 33 is not formed on the bonding surface 31*a* of the base 30*a* according to the modified example. Ends of the plurality of protrusions 32*pa* on the central part side are connected to one another at a center.

Figure 11:
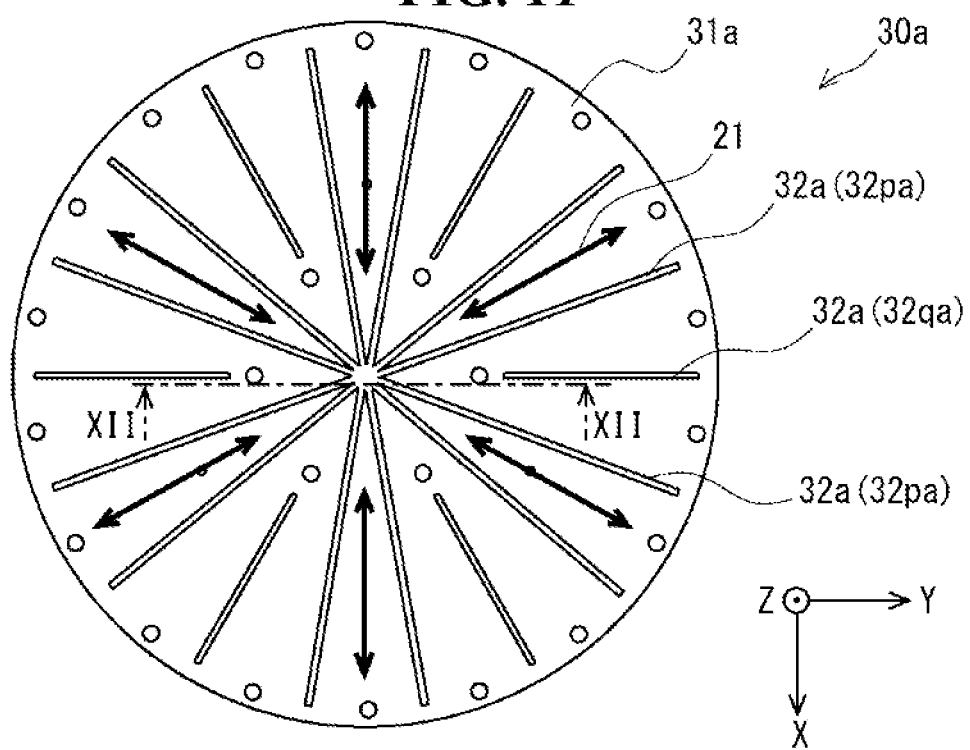
FIG. 11 is a plan view illustrating a thermal contraction process of a bonding agent which is being cooled in the electrostatic chuck device according to the modified example of Embodiment 1.
Figure 12:
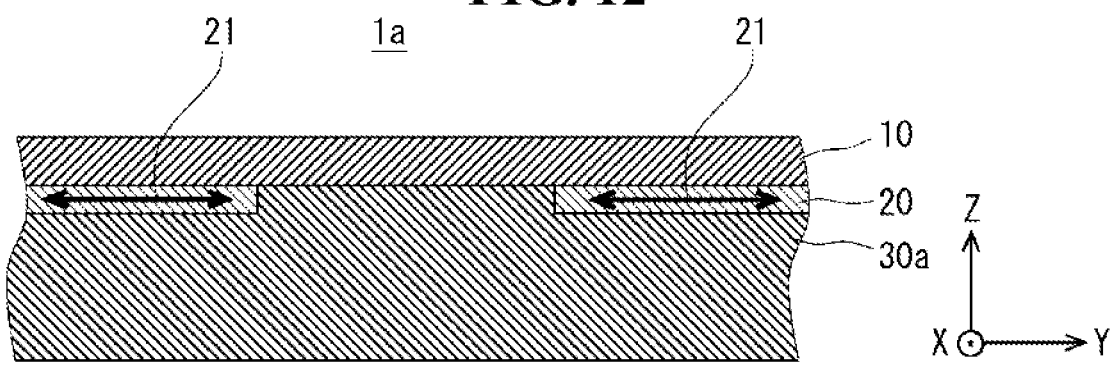
FIG. 12 is a cross-sectional view illustrating the thermal contraction process of the bonding agent which is being cooled in the electrostatic chuck device according to the modified example of Embodiment 1 and illustrates a cross-section taken along line XII-XII of FIG. 11.
Figure 13:
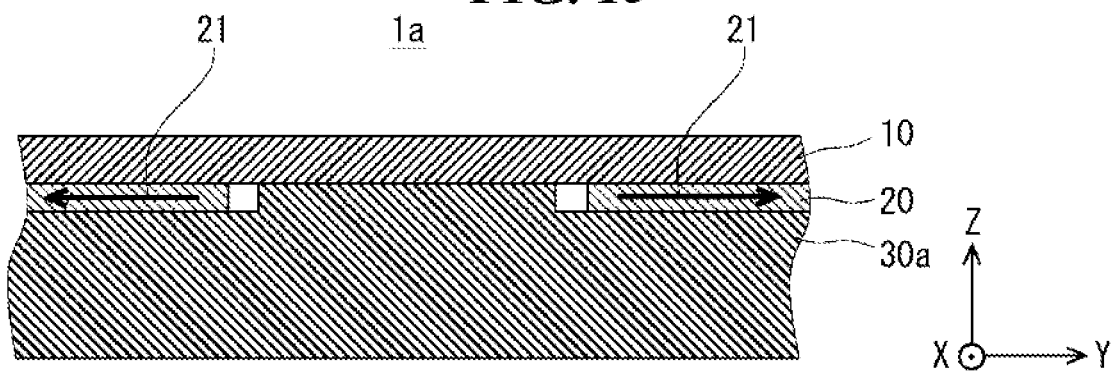
FIG. 13 is a cross-sectional view illustrating the thermal contraction process of the bonding agent which is being cooled in the electrostatic chuck device according to the modified example of Embodiment 1 and illustrates a cross-section taken along line XII-XII of FIG. 11.

FIG. 11 is a plan view illustrating a thermal contraction process of a bonding agent, which may be cooled in the electrostatic chuck device according to the modified example of Embodiment 1. FIGS. 12 and 13 are cross-sectional views illustrating the thermal contraction process of the bonding agent, which may be cooled in the electrostatic chuck device according to the modified example of the embodiment and illustrate a cross-section taken along line XII-XII of FIG. 11.

As shown in FIG. 11, in the modified example, since a direction in which the protrusions 32*a* extend is the same as a direction 21 in which the bonding agent thermally contracts, stresses generated between the electrostatic chuck plate 10 and the base 30*a* and the bonding layer 20 may be relieved.

Meanwhile, in the modified example, the central flat part 33 is not formed on the bonding surface 31*a* of the base 30*a*. Ends of the protrusions 32*a* on the central part are connected to one another at the center. Accordingly, a defect occurs near an intersection point of the protrusions 32*a* at the center of the bonding surface 31*a* due to thermal contraction after hardening. For example, the bonding agent is detached from a section of the center part in which the protrusions 32*a* are connected.

In detail, as shown in FIG. 12, in an electrostatic chuck device 1*a* of the modified example, a space between the electrostatic chuck plate 10 and the base 30*a* is filled with a bonding agent during a hardening process. Subsequently, as shown in FIG. 13, the bonding agent near the center is detached due to contraction after hardening. As described above, in the modified example, since a thermal expansion rate differs in the electrostatic chuck plate 10 and the base 30*a* and the bonding agent, extension and contraction of the bonding agent occur on side surfaces of the protrusions 32*a* at the central part. Accordingly, in the bonding layer 20 of the central part, stress resistance is reduced and the bonding agent is easily detached from a periphery of the protrusions 32*a* at the center part.

Comparative Example

Figure 14:
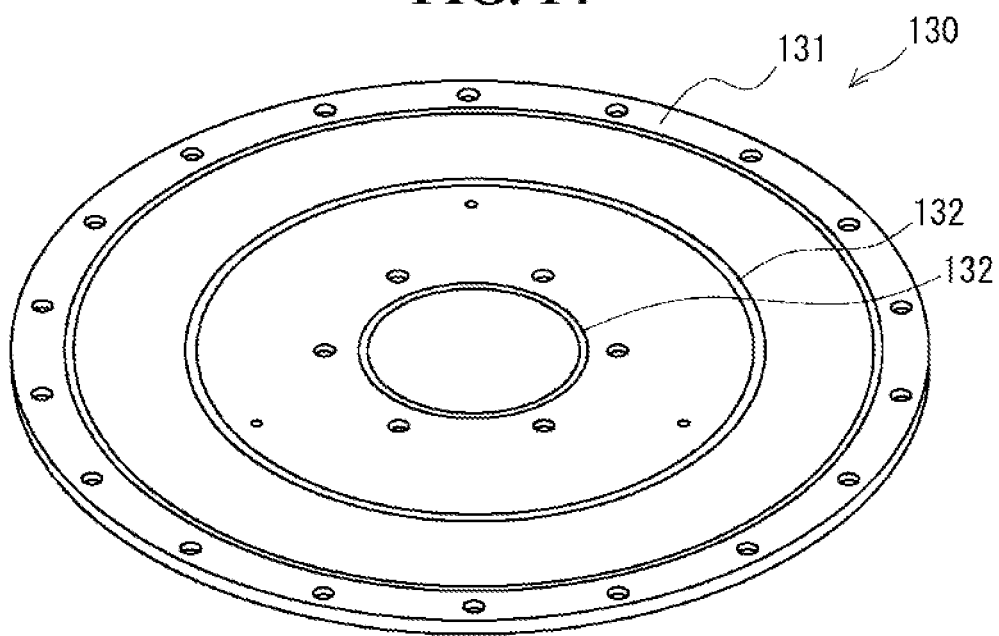
FIG. 14 is a perspective view illustrating a bonding surface of a base in an electrostatic chuck device according to a comparative example.

Subsequently, an electrostatic chuck device, according to a comparative example, will be described. FIG. 14 is a perspective view illustrating a bonding surface 131 of a base 130 in the electrostatic chuck device according to the comparative example. As shown in FIG. 14, in the electrostatic chuck device of the comparative example, a plurality of protrusions 132 are formed to have concentric circle shapes on the bonding surface 131 of the base 130. The protrusions 132 are formed, for example, by arranging a plurality of wires with certain diameters in concentric circle shapes. Other components are equal to those of Embodiment 1.

Evaluation of Electrostatic Chuck Device

Next, evaluation of the electrostatic chuck devices according to Embodiment 1, the modified example, and the comparative example will be described.

Evaluation items for the electrostatic chuck device are 1. a thickness of the bonding layer 20, 2. a defect of the bonding layer 20, 3. a temperature cycle test, and 4. a temperature deviation when a wafer is heated as a specimen.

1. The thickness of the bonding layer 20 is calculated from the thickness of the entire electrostatic chuck device using a three-dimensional measurement apparatus. 2. The defect of the bonding layer 20 is detected by a defect test on the electrostatic chuck plate 10 of the electrostatic chuck device using an ultrasonic defect detection apparatus. 3. A temperature cycle test of −100° C. to 100° C. is performed thirty times on the electrostatic chuck device and then the defect test is performed using the ultrasonic detection apparatus again. 4. A temperature deviation when a wafer is heated as a specimen is measured by measuring a temperature deviation of a wafer substrate while the wafer substrate is fixedly adsorbed onto the electrostatic chuck plate 10 and heat of 3 kW is applied from the outside.

Embodiment 1-1

An electrostatic chuck device of Embodiment 1-1 is based on the electrostatic chuck device described in Embodiment 1 and includes a central flat part without protrusions 32 formed thereon in a central part of the base 30. A material of the base 30 is a compound such as silicon carbide-aluminum (SiC—Al), a material of the electrostatic chuck plate 10 is $Al_2O_3$, and a material of the bonding layer 20 is indium. Additionally, or alternatively, the bonding surface 31 of the base 30 has the plurality of protrusions 32 shown in FIGS. 2 to 5 and the height of the protrusions 32 is 100 μm.
 1. Thickness of Bonding Layer 20
 Since the thickness of the bonding layer 20 is within a range of 100±25 μm, the electrostatic chuck device of Embodiment 1-1 passes.
 2. Defect of Bonding Layer 20
 Since there is no great defect in the bonding layer 20 and a bonding area is 99% or more, the electrostatic chuck device of Embodiment 1-1 passes.
 3. Temperature Cycle Test
 Since there is no change in results of detect tests before and after a temperature cycle test, the electrostatic chuck device of Embodiment 1-1 passes.
 4. Temperature Deviation When Wafer Was Heated as Specimen
 Since a temperature deviation of a wafer substrate is within a range of ±3° C., the electrostatic chuck device of Embodiment 1-1 passes.

Embodiment 1-2

An electrostatic chuck device of Embodiment 1-2 is based on the electrostatic chuck device described in the above-described embodiment and includes a central flat part without protrusions 32 formed thereon in a central part of the base 30. A material of the base 30 is a sprayed film of $Al_2O_3$ formed on SiC, and a material of the electrostatic chuck plate 10 is AlN. Additionally, or alternatively, the bonding surface 31 of the base 30 has the plurality of protrusions 32 shown in FIGS. 2 to 5 and the height of the protrusions 32 is 100 μm.
 1. Thickness of Bonding Layer 20
 Since the thickness of the bonding layer 20 is within a range of 100±25 μm, the electrostatic chuck device of Embodiment 1-2 passes.
 2. Defect of Bonding Layer 20
 Since there is no great defect in the bonding layer 20 and a bonding area is 99% or more, the electrostatic chuck device of Embodiment 1-2 passes.
 3. Temperature Cycle Test
 Since there is no change in the results of detect tests before and after a temperature cycle test, the electrostatic chuck device of Embodiment 1-2 passes.
 4. Temperature Deviation When Wafer Was Heated as Specimen
 Since a temperature deviation of a wafer substrate is within a range of ±3° C., the electrostatic chuck device of Embodiment 1-2 passes.

Embodiment 1-3

An electrostatic chuck device of Embodiment 1-3 is based on the electrostatic chuck device described in the above-described modified embodiment and includes the protrusions 32 connected in a central part of the base 30. A material of the base 30 is a sprayed film of $Al_2O_3$ formed on a compound such as SiC—Al, a material of the electrostatic chuck plate 10 is $Al_2O_3$, and a material of the bonding layer 20 is indium. Additionally, or alternatively, the bonding surface 31a of the base 30a has the plurality of protrusions 32a shown in FIG. 10 and the height of the protrusions 32a is 100 μm.
 1. Thickness of Bonding Layer 20
 Since the thickness of the bonding layer 20 is within a range of 100±25 μm, the electrostatic chuck device of Embodiment 1-3 passes.
 2. Defect of Bonding Layer 20
 The electrostatic chuck device of Embodiment 1-3 shows the bonding agent is detached from a section of the central part in which the protrusions 32 were connected.
 3. Temperature Cycle Test
 In the electrostatic chuck device of Embodiment 1-3, the bonding agent is detached from the section of the central part in which the protrusions 32 were connected.
 4. Temperature Deviation when Wafer was Heated as Specimen
 The electrostatic chuck device of Embodiment 1-3 shows a central part of a wafer substrate was abnormally cooled.

Embodiment 1-4

An electrostatic chuck device of Embodiment 1-4 is based on the electrostatic chuck device described in the above-described comparative example and includes the protrusions 132 with concentric circle shapes. A material of the base 30 is a compound such as SiC—Al, a material of the electrostatic chuck plate 10 is $Al_2O_3$, and a material of the bonding layer 20 is indium. Additionally, or alternatively, on the bonding surface 31 of the base 30, as shown in FIG. 14, the plurality of protrusions 132 with certain diameters are arranged in concentric circle shapes. The height of the protrusions 32 is 100 μm.
 1. Thickness of Bonding Layer 20
 Since a thickness deviation of the bonding layer 20 is 100±50 μm, the electrostatic chuck device of Embodiment 1-4 fails.
 4. Temperature Deviation when Wafer was Heated as Specimen
 Since an in-plane temperature deviation of a wafer substrate is ±7° C., the electrostatic chuck device of Embodiment 1-4 fails.

Subsequently, effects of the electrostatic chuck devices according to the embodiment and the modified example of the embodiment will be described. The electrostatic chuck device 1 or 1a according to the embodiment or the modified example include the plurality of protrusions 32 extending radially on the bonding surface 31 of the base 30 or 30a (hereinafter, the base 30 or 30a is referred collectively to as the base 30, and the bonding surface 31a and the protrusions 32a are referred collectively to as the bonding surface 31 and the protrusions 32, respectively). Accordingly, a direction in which the protrusions 32 extend is in accordance with direction 21 in which the bonding agent thermally expands and thermally contracts. Accordingly, stresses caused by thermal expansion rates of the electrostatic chuck plate 10, the bonding layer 20, and the base 30 may be relieved and the thickness of the bonding layer 20 may be equalized. Accordingly, heat transfer may be equalized.

Meanwhile, in the electrostatic chuck device of the comparative example, the protrusions 132 have concentric circle shapes and are not in accordance with direction 21 in which the bonding agent thermally expands and thermally contracts. Accordingly, stresses caused by thermal expansion rates of the electrostatic chuck plate 10, the bonding layer 20, and the base 130 may not be relieved and the thickness of the bonding layer 20 may not be equalized.

Since the electrostatic chuck devices 1 or 1a of the embodiment or the modified example include the base 30 with a stiff material, deformation may be suppressed even when a pressure is applied while the electrostatic chuck plate 10 is bonded to the base 30. Accordingly, the precision of the thickness of the bonding layer 20, which may be controlled by the protrusions 32 may be improved. Additionally, or alternatively, the protrusions 32 are disposed to be embedded in the bonding agent. Accordingly, stress generated in the bonding agent may be calculated with a high degree of precision and thermal stress may be relieved.

An area in which the protrusions 32 of the base 30 come into contact with the rear surface 12 of the electrostatic chuck plate 10 is smaller than or equal to 60% of the rear surface 12. Accordingly, the bonding layer 20 may have a bonding force capable of bearing stress. Additionally, or alternatively, heat transfer may be controlled with a high degree of precision.

Additionally, or alternatively, the bonding agent, which has a great difference in thermal expansion from the electrostatic chuck plate 10 and the base 30, may be used to form the bonding layer 20. Accordingly, a variety of types of bonding agents may be used, a temperature range of using the bonding agent may be increased, and a variety of purposes of use may be present.

The plurality of protrusions 32 includes the plurality of protrusions 32p and the plurality of protrusions 32q with a smaller length than a length of the protrusions 32p. Additionally, or alternatively, the ends of the protrusions 32q on the central flat part 33 are arranged to be closer to the outer circumferential part 35 than the ends of the protrusions 32p on the central flat part 33. Accordingly, the force F generated in the bonding agent may be equalized.

In the electrostatic chuck device 1 of the embodiment, the central flat part 33 is formed on the bonding surface 31 of the base 30. Accordingly, a sync mark or a defect caused by thermal expansion or thermal contraction of the bonding layer 20 may be suppressed.

Since the hole through which wiring or the like of the internal electrode of the electrostatic chuck plate 10 passes is formed near the ends of the protrusions 32q on the central flat part 33, equalization of the force F generated in the bonding agent is not interfered with. Additionally, or alternatively, the function of the central flat part 33 is not degraded.

Embodiment 2

Next, an electrostatic chuck device, according to a second embodiment (Embodiment 2), will be described. As described above, in a technique of bonding the electrostatic chuck plate 10 to the base 30 in the electrostatic chuck device, a resin-based bonding agent may be used depending on purposes. The bonding agent between the electrostatic chuck plate 10 and the base 30 mainly performs a function of relieving thermal stress between the electrostatic chuck plate 10 and the base 30 and a function of smoothly transferring heat flowing into a specimen fixedly adsorbed onto the electrostatic chuck plate 10 to the base 30.

However, when the resin-based bonding agent is used, an available temperature for using the electrostatic chuck device is determined by a glass transition point, a decomposition point, and the like of a resin that may be used (silicone, epoxy, acryl, or the like). Accordingly, a range of available temperatures for using the electrostatic chuck device may be frequently decreased.

Additionally, or alternatively, since a resin has low heat conductivity, the resin interferes with smooth transfer of heat, which flows into the specimen adsorbed onto the electrostatic chuck plate 10, to the base 30. Accordingly, a material with high heat conductivity may be added to improve low heat conductivity as a filler. For example, a filler of AlN or $Al_2O_3$ is added so as to improve the heat conductivity. Due to an influence of adding the filler, particularly, in a silicone bonding agent with a low Young's modulus (elastic modulus), a Young's modulus of a hardener increases so that the ability of relieving thermal stress is significantly degraded. Additionally, or alternatively, when an excessive amount of the filler is added, the ability of handling a bonding agent is degraded so as to degrade work efficiency.

Accordingly, in the embodiment, there is used a resin-based bonding agent which may suppress an increase in a Young's modulus within a range from a room temperature to an extremely low-temperature band even when a glass transition temperature is low and a filler is added. Since the resin has a great thermal expansion coefficient, thermal expansion rates of the electrostatic chuck plate 10 and the base 30 coincide with each other so as not to receive thermal stress. Additionally, or alternatively, an electrostatic chuck device which may be available in a wide temperature band from a room temperature band to an extremely low-temperature band is provided by optimizing hardening conditions of a bonding agent with a filler. Hereinafter, Embodiment 2-1 to Embodiment 2-4, using a resin-based bonding agent, will be described.

Embodiment 2-1

An electrostatic chuck device of Embodiment 2-1 includes components based on the electrostatic chuck device described in Embodiment 1. Respective materials included in the base 30, the electrostatic chuck plate 10, and a bonding agent will be described as follows.

A. Materials

Base: SiC—Al Composite Material

Electrostatic Chuck Plate: $Al_2O_3$

Bonding Agent: Silicone Bonding Agent (4.5 W/mK) With Nitride Filler

B. Manufacturing Method

A method of manufacturing an electrostatic chuck device of the embodiment includes, like the above-described method of manufacturing the electrostatic chuck device of Embodiment 1, operation 11 and operation 12 of FIG. 9 being performed.

Subsequently, in operation 13, a bonding agent is applied to the electrostatic chuck plate 10 and the base 30, and defoaming treatment is performed in a vacuum state at a temperature of 50° C. for 30 min. Additionally, or alternatively, the electrostatic chuck plate 10 and the base 30 are attached to each other, a pressure of 6 kPa is applied thereto, and defoaming treatment is performed again in a vacuum state at a temperature of 50° C. for 30 min.

Subsequently, after being exposed to atmospheric pressure, the pressure increases to 9 kPa and the electrostatic chuck plate 10 and the base 30 are paused for 60 min. Subsequently, in this state, a temperature is increased to 90° C., and the electrostatic chuck plate 10 and the base 30 are paused for 20 min and hardened. Additionally, or alternatively, in the state in which the pressure is applied, the electrostatic chuck plate 10 and the base 30 are cooled to be 30° C. or lower. Cooling is performed to room temperature, and the bonding agent is hardened.

C. Evaluation Method

Next, a method of evaluating an electrostatic chuck device will be described. A deformation is calculated from an entire thickness of the electrostatic chuck device using a three-dimensional measurement apparatus. In Embodiment 2-1, since a plan view was within a range of 80 μm or less, the electrostatic chuck device passed.

A defect test is performed on the electrostatic chuck plate 10 of the electrostatic chuck device using an ultrasonic defect detection apparatus. Since there is no great defect in a bonding layer and a bonding area is 99% or more, the electrostatic chuck device is determined to pass. A temperature cycle test of −150° C. to 100° C. is performed thirty times on the electrostatic chuck device. After the temperature cycle test, the defect test is performed using the ultrasonic defect detection apparatus again. In Embodiment 2-1, since there was no great defect in the bonding layer before and after the temperature cycle test, the electrostatic chuck device passed.

A temperature of a wafer is measured when heat of 5.5 kW is input while a wafer substrate is fixedly adsorbed onto the electrostatic chuck plate 10 and cooled at a temperature of −150° C. Since the temperature of the wafer was −135° C. in Embodiment 2-1, the electrostatic chuck device passed.

D. Evaluation of Tensile Load

An exclusive jig is formed through machining. An exclusive jig is bonded instead of the electrode chuck plate 10 in the same conditions and operations as the method of manufacturing the electrostatic chuck device. Additionally, or alternatively, a sample is cooled at a certain temperature 23° C. and −150° C. The cooled sample is mounted on a universal tester and vertically pulled. A load when the bonded exclusive jig is broken from the bonding layer 20 is measured.

Embodiment 2-2

Next, Embodiment 2-2 will be described. In an electrostatic chuck device of Embodiment 2-2, respective materials included in the base 30, the electrostatic chuck plate 10, and a bonding agent will be described as follows.

A. Materials

Base: SiC—Al Composite Material

Electrostatic Chuck Plate: $Al_2O_3$

Bonding Agent: Silicone Bonding Agent (0.15 W/mK) Excluding Filler

B. Manufacturing Method

A manufacturing method may be similar to that of Embodiment 2-1.

C. Evaluation Method

In Embodiment 2-2, since a plan view was within a range of 80 μm or less, the electrostatic chuck device passed. In Embodiment 2-2, since there was no change in the bonding layer 20 before and after the temperature cycle test, the electrostatic chuck device passed. A temperature of a wafer was −95° C. when heat of 5.5 kW was input while a wafer substrate was fixedly adsorbed onto the electrostatic chuck plate 10 and cooled at a temperature of −150° C., and the electrostatic chuck device passed.

Embodiment 2-3

Next, Embodiment 2-3 will be described. In an electrostatic chuck device of Embodiment 2-3, respective materials included in the base 30, the electrostatic chuck plate 10, and a bonding agent will be described as follows.

A. Materials

Base: SiC—Al Composite Material

Electrostatic Chuck Plate: $Al_2O_3$

Bonding Agent: Silicone Bonding Agent (0.5 W/mK) With Oxide Filler

B. Manufacturing Method

A manufacturing method may be similar to that of Embodiment 2-1.

C. Evaluation Method

In Embodiment 2-3, since a plan view was within a range of 80 μm or less, the electrostatic chuck device passed. In Embodiment 2-3, since there was no change in the bonding layer 20 before and after the temperature cycle test, the electrostatic chuck device passed. A temperature of a wafer was −110° C. when heat of 5.5 kW was input while a wafer substrate was fixedly adsorbed onto the electrostatic chuck plate 10 and cooled at a temperature of −150° C., and the electrostatic chuck device passed.

Embodiment 2-4

Next, Embodiment 2-4 will be described. In an electrostatic chuck device of Embodiment 2-4, respective materials included in the base 30, the electrostatic chuck plate 10, and a bonding agent will be described as follows.

A. Materials

Base: Al Material

Electrostatic Chuck Plate: $Al_2O_3$

Bonding Agent: Silicone Bonding Agent (4.5 W/mK) With Nitride Filler

B. Manufacturing Method

A manufacturing method may be similar to that of Embodiment 2-1.

C. Evaluation Method

In Embodiment 2-4, since a plan view was within a range of 90 μm to 110 μm, the electrostatic chuck device passed. In Embodiment 2-4, since there was no change in the bonding layer 20 before and after the temperature cycle test, the electrostatic chuck device passed. A temperature of a wafer was −135° C. when heat of 5.5 kW was input while a wafer substrate was fixedly adsorbed onto the electrostatic chuck plate 10 and cooled at a temperature of −150° C., and the electrostatic chuck device passed.

According to the embodiment, for example, the bonding agent may include a thermosetting resin and have heat conductivity of 4.0 W/(mK) or higher. In the case of a silicone bonding agent with a nitride filler, heat conductivity is 4.5 W/mK and highly evaluated as shown in Embodiment 2-1 and Embodiment 2-4.

Additionally, or alternatively, the bonding agent may have a Young's modulus of 1 GPa or less at a temperature of −150° C. Additionally, or alternatively, a rate of change in the Young's modulus when the bonding agent is cooled at a temperature from 23° C. to −150° C. may be 500% or less. Additionally, or alternatively, a tensile load when the bonding is cooled at a temperature from 23° C. to −150° C. agent may be smaller than or equal to fifteen times per area of 12.6 cm².

The bonding agent may include at least one of a silicone resin, an epoxy resin, and an acrylic resin. Additionally, or alternatively, the bonding agent may have a decomposition temperature of 260° C. or higher. For example, the bonding agent may not be decomposed and be used at a temperature lower than 260° C.

The bonding agent may include a heat-conductive filler by 35% to 45%. The heat-conductive filler may be 25 μm or less with a grain size of D90 and may be less than 10 Lim with a grain size of D50. When 90% of the heat-conductive filler has a grain size of 25 μm or less, and 50% of the heat-conductive filler may have a grain size less than 10 μm. Additionally, or alternatively, viscosity of the bonding agent may be smaller than or equal to 10 Pas.

A decomposition temperature of the bonding agent before thermosetting may be 300° C. or higher. The heat-conductive filler included in the bonding agent may include at least one of AlN, silicon nitride ($Si_3N_4$), boron nitride, and SiC.

Both the electrostatic chuck plate 10 and the base 30 may include at least one of Al, yttrium oxide, SiC, $Al_2O_3$, and AlN. A difference in thermal expansion between the electrostatic chuck plate 10 and the base may be $1\times10^{-6}/°$ C. or less for each temperature from 23° C. to −100° C.

Next, effects of the embodiment will be described. The electrostatic chuck device of the embodiment may be utilized at an extremely low temperature band of a temperature of about −100° C. In detail, in the electrostatic chuck device, a Young's modulus of the bonding layer 20 does not increase even in the extremely low-temperature band. Accordingly, thermal stress is continuously relieved in the electrostatic device. Deformation in use may be suppressed since the thermal stress is relieved. Additionally, or alternatively, since deformation in a stage on which a specimen is placed is reduced, the temperature of the specimen may be controlled to be uniform. Additionally, or alternatively, due to high heat conductivity, heat transfer of the bonding layer 20 may be improved. Other components and effects are included in the description of Embodiment 1.

As a result, the electrostatic chuck device, according to an embodiment of the present disclosure, can uniformly cool or heat a fixedly adsorbed specimen.

The present disclosure is not limited to the above embodiments and may be adequately changed without departing from the scope. For example, respective components of Embodiments 1 and 2 and the modified example may be combined with one another.

What is claimed is:

1. An electrostatic chuck device comprising:
   an electrostatic chuck plate;
   a bonding layer comprising a bonding agent bonded to a rear surface of the electrostatic chuck plate; and
   a base comprising a bonding surface bonded to the bonding layer and a plurality of protrusions on the bonding surface radially extending from a central part of the base toward an outer circumferential part of the base, wherein the protrusions are in direct contact with the rear surface.

2. The electrostatic chuck device of claim 1, wherein ends of the respective protrusions are arranged at intervals around the central part.

3. The electrostatic chuck device of claim 2, wherein the central part of the base has a central flat part surrounded by the ends.

4. The electrostatic chuck device of claim 1, wherein ends of at least two of the protrusions on the central part are connected.

5. An electrostatic chuck device comprising:
   an electrostatic chuck plate;
   a bonding layer comprising a bonding agent bonded to a rear surface of the electrostatic chuck plate; and
   a base comprising a bonding surface bonded to the bonding layer and a plurality of protrusions on the bonding surface radially extending from a central part of the base toward an outer circumferential part of the base, wherein the plurality of protrusions comprise:
   a plurality of first protrusions having a first length extending in an extension direction of the protrusions; and
   a plurality of second protrusions having a second length smaller than the first length,
   wherein ends of the second protrusions on the central part are arranged to be closer to the outer circumferential part than ends of the first protrusions on the central part.

6. The electrostatic chuck device of claim 5, wherein holes are formed in the bonding surface near the ends of the second protrusions on the central part.

7. The electrostatic chuck device of claim 1, wherein the protrusions are embedded in the bonding agent.

8. The electrostatic chuck device of claim 1,
   wherein an area of the protrusions coming into contact with the rear surface is smaller than or equal to 60% of an area of the rear surface.

9. The electrostatic chuck device of claim 1, wherein the base comprises a flow path through which a refrigerant flows.

10. The electrostatic chuck device of claim 1, wherein a Young's modulus of the base is 200 GPa or higher,
    wherein a difference between a thermal expansion rate of the base and a thermal expansion rate of the electrostatic chuck plate is less than $1\times10^{-6}/°$ C., and
    wherein heat conductivity of the base is 50 W/(mK) or higher.

11. The electrostatic chuck device of claim 1, wherein the base comprises at least one of aluminum, metal-based composite material, silicon carbide, silicon, aluminum oxide, and aluminum nitride.

12. The electrostatic chuck device of claim 1, wherein the electrostatic chuck plate comprises an internal electrode, and
    wherein the electrostatic chuck plate comprises at least one of yttrium oxide, silicon carbide, aluminum oxide, and aluminum nitride.

13. The electrostatic chuck device of claim 1, wherein the bonding agent comprises at least one of indium, aluminum, silver, and tin, comprises an alloy comprising at least one of indium, aluminum, silver, and tin, or comprises at least one of a silicone resin, an acrylic resin, and an epoxy resin.

14. An electrostatic chuck device comprising:
    an electrostatic chuck plate;
    a bonding layer comprising a bonding agent bonded to a rear surface of the electrostatic chuck plate; and
    a base comprising a bonding surface bonded to the bonding layer and a plurality of protrusions on the bonding surface radially extending from a central part of the base toward an outer circumferential part of the base, wherein the bonding agent comprises a thermosetting resin, and wherein the bonding agent has heat conductivity of 4.0 W/(mK) or higher and a Young's modulus of 1 GPa or lower at a temperature of −150° C.

15. The electrostatic chuck device of claim 14, wherein the bonding agent has a rate of change in the Young's modulus less than 500% when being cooled at a temperature from 23° C. to −150° C. and has a tensile load of fifteen times or less per area of 12.6 cm² when being cooled at a temperature from 23° C. to −150° C.

16. The electrostatic chuck device of claim 14, wherein the bonding agent comprises at least one of a silicone resin, an epoxy resin, and an acrylic resin and has a decomposition temperature of 260° C. or higher.

17. The electrostatic chuck device of claim 14, wherein the bonding agent comprises 35% to 45% of a heat-conductive filler, wherein the heat-conductive filler is 25 μm or less with a grain size of D90 and is less than 10 μm with a grain size of D50, and wherein viscosity of the bonding agent is lower than or equal to 10 Pas.

18. The electrostatic chuck device of claim 14, wherein a decomposition temperature of the bonding agent before thermosetting is 300° C. or higher, wherein the bonding agent comprises a heat-conductive filler, and wherein the heat-conductive filler is 25 μm or less with a grain size of D90 and is less than 10 μm with a grain size of D50.

19. The electrostatic chuck device of claim 17, wherein the heat-conductive filler comprises at least one of aluminum nitride, silicon nitride, boron nitride, and silicon carbide.

20. The electrostatic chuck device of claim 14, wherein both the electrostatic chuck plate and the base comprise at least one of aluminum, yttrium oxide, silicon carbide, aluminum oxide, and aluminum nitride.

* * * * *